(12) United States Patent
Crocker et al.

(10) Patent No.: US 7,543,457 B2
(45) Date of Patent: Jun. 9, 2009

(54) SYSTEMS FOR INTEGRATED PUMP AND RESERVOIR

(75) Inventors: Michael T. Crocker, Portland, OR (US); Daniel P. Carter, Olympia, WA (US); Kazimierz L. Kozyra, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 601 days.

(21) Appl. No.: 11/170,427

(22) Filed: Jun. 29, 2005

(65) Prior Publication Data

US 2007/0000268 A1    Jan. 4, 2007

(51) Int. Cl.
F25D 23/02    (2006.01)

(52) U.S. Cl. .............. 62/259.2; 361/698; 361/699; 361/702; 165/80.2; 165/80.3; 165/80.4; 165/104.33; 417/423.14; 417/423.7; 417/423.8; 415/204; 415/206

(58) Field of Classification Search .............. 62/259.2; 361/699, 698, 702; 165/80.2–80.4, 104.33; 417/372, 423.14, 423.7, 423.8, 423.1–423.4; 239/214.21, 128; 257/714; 174/15.2, 252; 415/175–178, 204, 206

See application file for complete search history.

(56) References Cited

U.S. PATENT DOCUMENTS

| 6,191,945 | B1* | 2/2001 | Belady et al. ............... 361/704 |
|---|---|---|---|
| 6,408,937 | B1* | 6/2002 | Roy ........................ 165/104.33 |
| 6,648,064 | B1 | 11/2003 | Hanson |
| 6,668,911 | B2* | 12/2003 | Bingler ....................... 165/80.4 |
| 2003/0151892 | A1* | 8/2003 | Kondo et al. ................. 361/687 |
| 2003/0188538 | A1* | 10/2003 | Chu et al. ...................... 62/3.2 |
| 2004/0042176 | A1 | 3/2004 | Niwatsukino et al. |
| 2004/0052663 | A1 | 3/2004 | Laing et al. |
| 2004/0105232 | A1 | 6/2004 | Ito et al. |
| 2006/0051222 | A1* | 3/2006 | Lee et al. ................ 417/423.14 |

FOREIGN PATENT DOCUMENTS

EP    1 398 511 A1    3/2004

OTHER PUBLICATIONS

"PCT International Search Report of the International Searching Authority", mailed Nov. 9, 2006, for PCT/US2006/025479, 4pgs.

* cited by examiner

*Primary Examiner*—Frantz F. Jules
*Assistant Examiner*—Azim Rahim
(74) *Attorney, Agent, or Firm*—Buckley, Maschoff & Talwalkar LLC

(57) ABSTRACT

According to some embodiments, systems for an integrated pump and reservoir may be provided. In some embodiments, a pump may comprise a housing defining an inlet to accept a fluid and an outlet to evacuate the fluid, an impeller disposed within the housing, wherein the impeller is to move the fluid toward the outlet, a motor to power the impeller, a reservoir hydraulically coupled to the inlet, and a cold plate disposed at least partially within the housing.

16 Claims, 6 Drawing Sheets

SYSTEMS FOR INTEGRATED PUMP AND RESERVOIR

BACKGROUND

Electrical devices, such as computers, are comprised of multiple electrical components (e.g., processors, voltage regulators, and/or memory devices). Electrical components typically dissipate unused electrical energy as heat, which may damage the electrical components and/or their surroundings (e.g., other electrical components and/or structural devices such as casings, housings, and/or electrical interconnects). Various means, such as heat sinks and heat pipes, have been utilized to control and/or remove heat from electrical components and their surroundings.

As electrical devices, such as personal computer (PC) devices and even computer servers, are reduced in size however, space and cost constraints become limiting design factors. Typical heat mitigation devices, for example, take up considerable amounts of room within electrical devices and/or include expensive components. As electrical devices increase in processing speed and power, their components will generate even more heat that must be removed. Typical heat mitigation devices may not be suitable for removing adequate amounts of heat from electrical components, particularly where space and cost are concerns.

DETAILED DESCRIPTION

Figure 1:
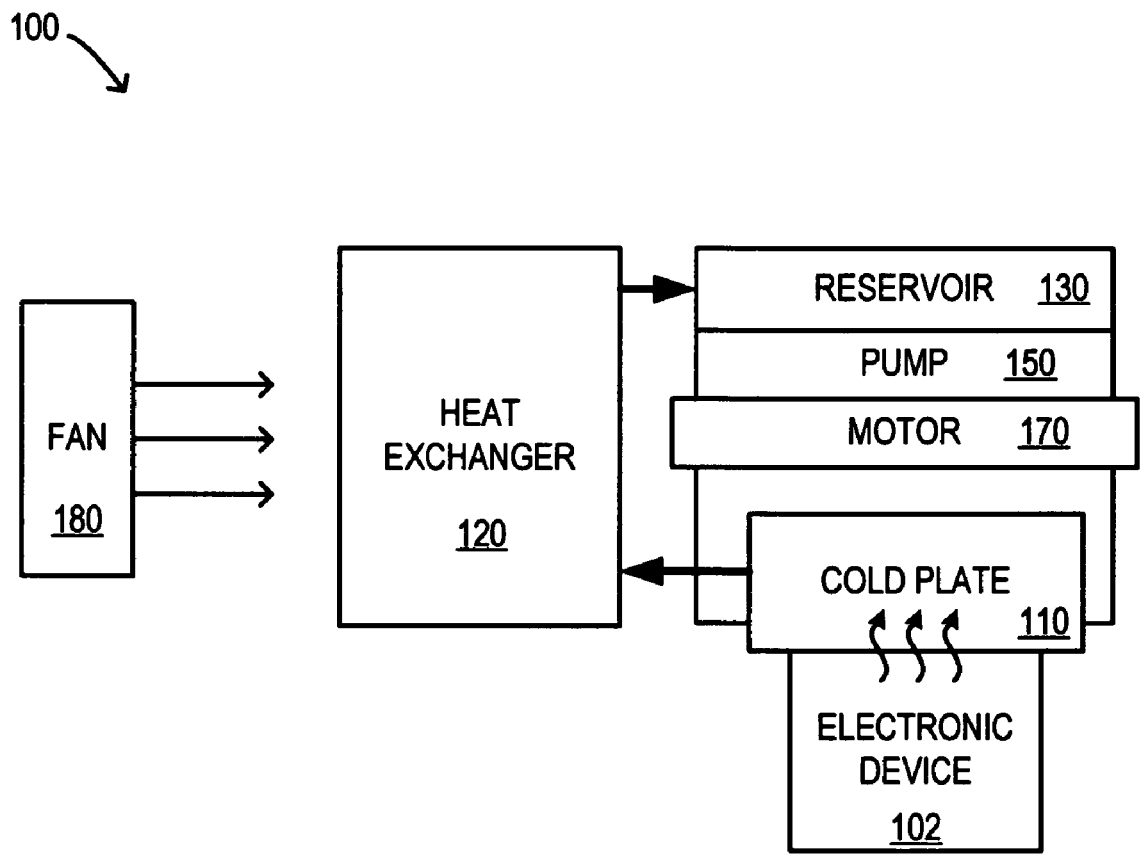
FIG. 1 is a block diagram of a system according to some embodiments.

Referring first to FIG. 1, a block diagram of a system 100 according to some embodiments is shown. The various systems described herein are depicted for use in explanation, but not limitation, of described embodiments. Different types, layouts, quantities, and configurations of any of the systems described herein may be used without deviating from the scope of some embodiments. Fewer or more components than are shown in relation to the systems described herein may be utilized without deviating from some embodiments.

The system 100 may comprise, for example, an electronic device 102 (such as a processor, memory device, a voltage regulator, etc.), a cold plate 110, a heat exchanger 120, a reservoir 130, a pump 150, a motor 170, and/or a fan 180. In some embodiments, the electronic device 102 may generate heat and/or may transfer heat to the cold plate 110. The cold plate 110 may, for example, be coupled to the electronic device 102 to accept and/or remove heat from the electronic device 102. Heat may travel through conduction, in some embodiments, from the electronic device 102 to the cold plate 110 (e.g., as depicted via the wavy lines in FIG. 1).

In some embodiments, the cold plate 110 may transfer heat to the heat exchanger 120. The heat exchanger 120 may, for example, be a heat sink and/or radiator configured to expel and/or dissipate heat. In the case that the heat exchanger 120 comprises fins (not shown in FIG. 1) for dissipating heat, for example, the fan 180 may facilitate the removal and/or dissipation of heat from the heat exchanger 120. The fan 180 may, in some embodiments, direct air toward the heat exchanger 120 (and/or any fins thereof) to facilitate forced convection to remove heat from the heat exchanger 120. In some embodiments, the fan 180 may be disposed, configured, and/or otherwise may be operable to direct air toward the heat exchanger 120 from one or more of a variety of directions.

The pump 150 may, according to some embodiments, circulate a fluid within the system 100. The pump 150 may, for example, comprise a housing (not shown in FIG. 1) that defines an inlet to accept the fluid and an outlet to evacuate the fluid. According to some embodiments, the pump 150 may also or alternatively comprise an impeller (not shown in FIG. 1) powered by the motor 170. For example, the heat transferred by the electronic device 102 to the cold plate 110 may be directed to and/or transferred to (e.g., conducted to) a fluid (such as water and/or propylene glycol) that circulates through and/or over the cold plate 110. The heated fluid may then, for example, be forced and/or moved by the pump 150 to the heat exchanger 120 (e.g., via the housing outlet) to transfer heat to the heat exchanger 120 and/or to otherwise dissipate the heat within the fluid. The heat exchanger 120 may, for example, remove heat from the fluid. The cooled fluid (e.g., cooled relative to the heated fluid and/or the cold plate 110) may then proceed to the reservoir 130. The reservoir 130 may, for example, store a quantity of the fluid for use in the system 100. The fluid may then, for example, circulate through the pump 150 (e.g., a centrifugal pump) and/or be drawn from the reservoir 130 by the pump 150. According to some embodiments, the reservoir 130 may be hydraulically coupled to the housing inlet of the pump 150. The fluid may, for example, be directed into the housing inlet of the pump 150 and then proceed (and/or be directed) back to the cold plate 110 to remove more heat from the cold plate 110 (e.g., by allowing heat to transfer from the cold plate 110 into the cooled fluid).

In some embodiments, any or all of the components 102, 110, 120, 130, 150, 170, 180 of the system 100 may be oriented and/or configured to save space and/or to increase efficiency. As shown in FIG. 1, for example, the cold plate 110, the reservoir 130, and/or the motor 170 may be coupled to and/or combined with the pump 150. The cold plate 110 and the motor 170 may, for example, be at least partially disposed within the pump 150. According to some embodiments, the reservoir 130 may also or alternatively be integrated with the pump 150. The integration and/or coupling of the components 110, 130, 150, 170 may, for example, reduce the length of the fluid travel path within the system 100, reduce the space occupied and/or required by the system 100, reduce the number of dynamic and/or other fluid seals required in the system 100, and/or may otherwise provide advantages over previous cooling solution systems. In some embodiments, integration of the reservoir 130 with the pump 150 may facilitate the operation and/or coupling of the pump 150 with respect to the heat exchanger 120.

Figure 2A:
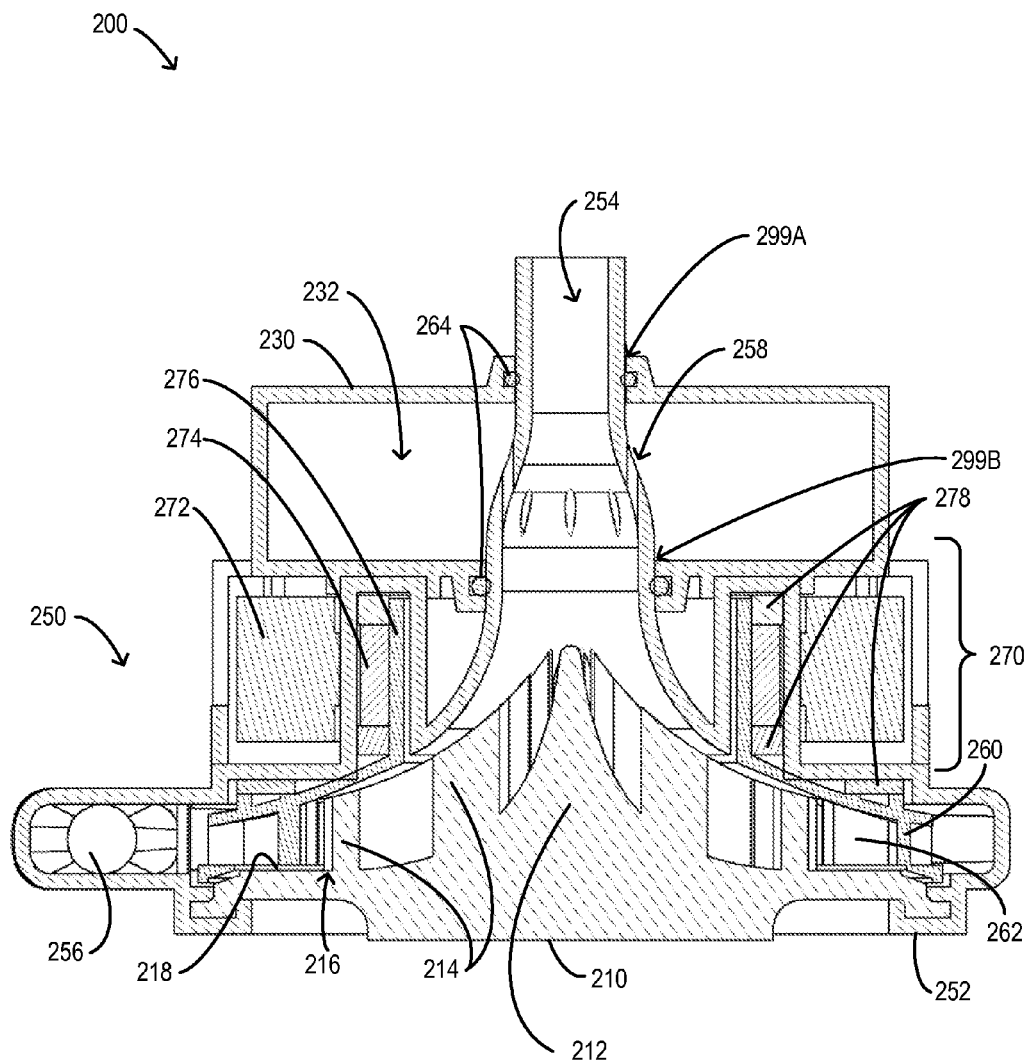
FIG. 2A is a cross-sectional diagram of a system according to some embodiments.
Figure 2B:
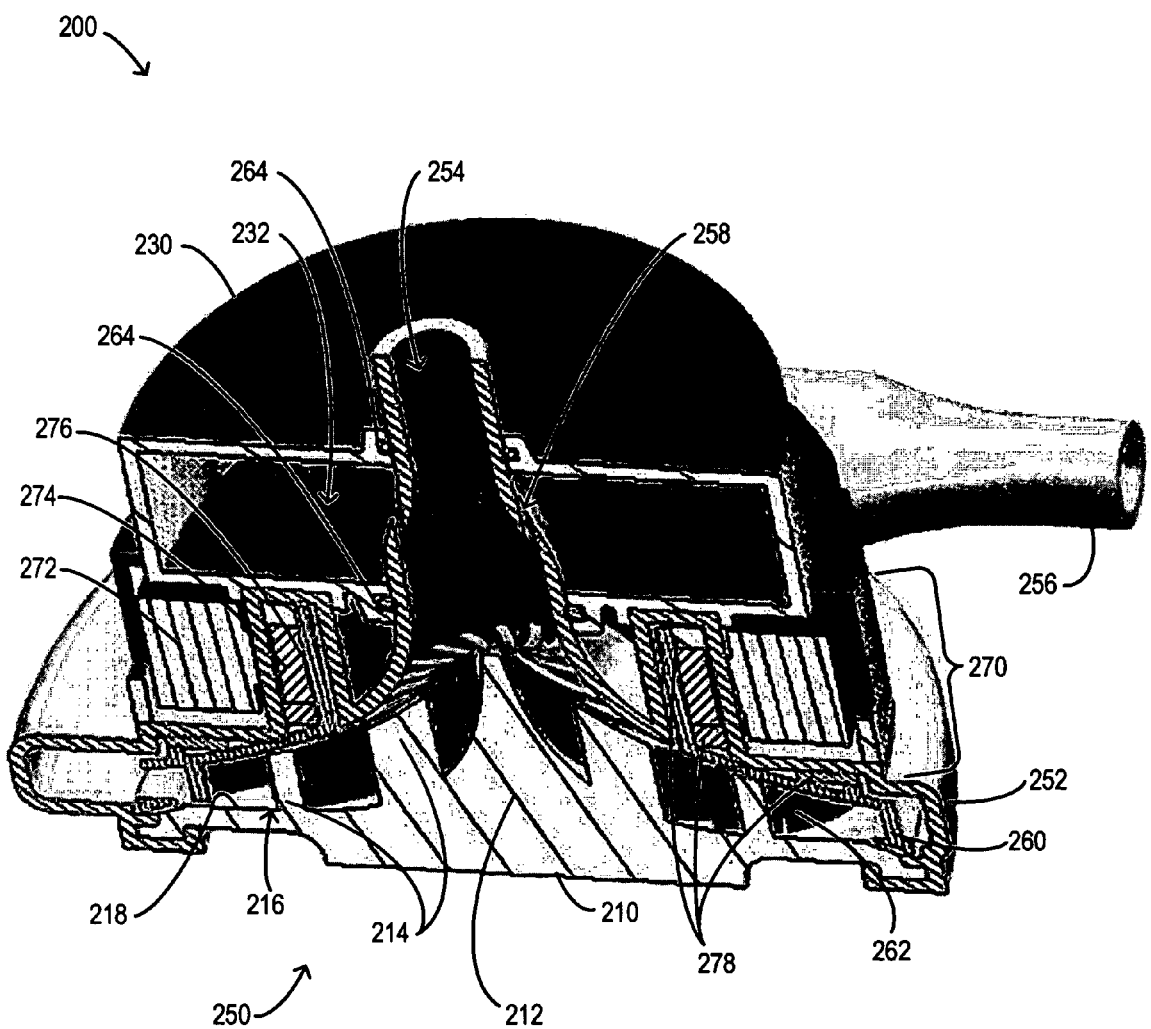
FIG. 2B is a perspective cross-sectional diagram of a system according to some embodiments.

Turning in more detail to FIG. 2A and FIG. 2B, a cross-sectional diagram of a system 200 and a perspective cross-sectional diagram of the system 200 according to some embodiments are shown, respectively. In some embodiments, the system 200 may be similar to the system 100 described in conjunction with FIG. 1. The system 200 may, for example, be associated with the removal, transfer, and/or dissipation (e.g., radiation) of heat. In some embodiments, fewer or more components than are shown in FIG. 2A or FIG. 2B may be included in the system 200. In some embodiments, the system 200 may comprise a cold plate 210. The cold plate 210 may, for example, comprise a center portion 212, fins 214, a radius 216, and/or a surface 218. In some embodiments, the cold plate 210 may comprise a plurality of cold plates (e.g., to remove heat from a plurality of electronic devices). According to some embodiments, the cold plate 210 may be or include an integrated heat spreader (IHS) coupled to an electronic device and/or electrical component (not shown in FIG. 2A or FIG. 2B). The cold plate 210 may, for example, receive heat from the electronic device (e.g., coupled to the underside of the cold plate 210). In some embodiments, a fluid may also or alternatively be passed over and/or through the cold plate 210 to remove heat from the cold plate 210.

In some embodiments, the fluid associated with removing heat from the cold plate 210 may flow to and/or from the cold plate 210 via various conduits, tubes, pipes, channels, and/or other connections or paths. According to some embodiments, the fluid may be stored in and/or otherwise hydraulically associated with a reservoir 230. The reservoir 230 may comprise and/or define, for example, a volume 232 that is accessible to the fluid. In some embodiments, the reservoir 230 may provide a thermal mass (e.g., air, water, and/or another fluid) to reduce the impact of large and/or severe thermal events. The reservoir 230 may, for example, store a quantity of fluid to supply extra fluid in the case that extra fluid is needed and/or to provide thermal dampening as required. According to some embodiments, if fluid leaks from the system 200 (e.g., due to old seals and/or from seepage through hydroscopic plastic elements or components) over the life of the system 200, for example, the extra fluid in the reservoir 230 may replenish the lost amounts.

The replacement and/or augmentation of the fluid within the fluid paths of the system 200 may, for example, substantially prevent air bubbles from forming and/or being introduced into the fluid flow. In some embodiments, the reservoir 230 (and/or the volume 232 defined thereby) may, for example, also or alternatively function as an air trap to collect air bubbles from the fluid flow. The reservoir 230 may, according to some embodiments, comprise one or more inserts and/or bladders (not shown). A foam element (not shown) may, for example, be disposed within the volume 232 of the reservoir 230. In some embodiments, the foam element may compress in the case that the fluid expands to exert increased forces within the system 200. In the case that the fluid expands upon heating and/or due to other environmental factors, for example, the foam may absorb the increased pressure in the system 200 to substantially avoid damage to any or all components associated with the fluid flow paths.

The system 200 may also or alternatively comprise a pump 250 comprising a housing 252. The housing 252 may, for example, define an inlet 254 and/or an outlet 256. In some embodiments, the pump 250 may be integrated with the cold plate 210 and/or with the reservoir 230. The cold plate 210 may, for example, be at least partially disposed within the pump housing 252. The reservoir 230 may, according to some embodiments, be hydraulically coupled to the inlet 254 and/or may be coupled to the pump housing 252 and/or the inlet 254. A hydraulic path 258 may, for example, allow fluid to flow between the volume 232 of the reservoir 230 and the inlet 254 of the pump 250. The pump 250 may also or alternatively comprise an impeller 260 comprising vanes 262. In some embodiments, the impeller 260 (and/or the vanes 262 thereof) may spin to draw and/or move the fluid into the inlet 254 and toward the cold plate 210. The fluid may be directed and/or moved, according to some embodiments, toward the outlet 256 to facilitate removal of heat from the cold plate 210.

For example, the central portion 212 of the cold plate 210 may be the hottest portion of the cold plate 210. An electrical component (not shown in FIG. 2A or FIG. 2B) may, for example, transfer more heat to the center of the cold plate 210 than to other portions of the cold plate 210. In some embodiments, the fluid entering the pump 250 via the inlet 254 may be initially directed to the central portion 212 of the cold plate 210. The central portion 212 may, as shown in FIG. 2A and FIG. 2B, for example, be extended upward and/or into the fluid path.

The fins 214 of the cold plate 210 may, according to some embodiments, be taller near the central portion 212 of the cold plate, and may decrease in height and/or size as the radius of the cold plate 210 increases. In such a manner, for example, the fluid may be in greater contact with the hottest portions (e.g., the central portion 212) of the cold plate 210, increasing the efficiency of the heat transfer from the cold plate 210 to the fluid. According to some embodiments, the fins 214 and/or the central portion 212 of the cold plate 210 may be configured to direct the fluid in a radial fashion outward from the central portion 212 of the cold plate 210 to the extremities of the cold plate 210. In such a manner, for example, a cross-flow of heat exchange may be accomplished by directing the coldest fluid (e.g., the fluid entering the inlet 254) over the hottest portions (e.g., the central portion 212) of the cold plate 212, while the increasingly heated fluid travels over increasingly cooler portions of the cold plate 210. This cross-flow heat exchange may, according to some embodiments, achieve high efficiencies of heat transfer between the cold plate 210 and the fluid.

In some embodiments, the cold plate 210 may also or alternatively function as a flow inducer for the impeller 260. The fins 214 of the cold plate 210 may, for example, be curved and/or otherwise configured to direct the fluid entering from the inlet 254 to the vanes 262 of the impeller 260. The fins 214 may, according to some embodiments, direct the incoming fluid in such a manner so as to increase the efficiency of ingestion of the fluid by the impeller 260. In other words, the direction of the fluid by the fins 214 of the cold plate 210 may reduce friction losses in the fluid flow and/or substantially prevent cavitation and/or other flow disruptions. In some embodiments, the curved nature of the fins 214 may also or alternatively increase the efficiency of heat transfer from the fins 214 to the fluid. The fluid may be scrubbed across the fins 214, for example, as the fluid is forced to change direction by the curved fins 214.

The fins 214 of the cold plate 210 may, according to some embodiments, extend from the central portion 212 of the cold plate 210 to the radius 216 defined by the cold plate 210. The fins 214 may terminate at the radius 216, for example, to provide the surface 218 on the cold plate 210. The surface 218 may, according to some embodiments, provide an area through which the vanes 262 of the impeller 260 may travel. The vanes 262 of the impeller 260 may, for example, travel around the radius 216 of the cold plate 210 (e.g., around the fins 214 and/or on the surface 218). The vanes 262 may, according to some embodiments, direct the fluid received from the fins 214 to the outlet 256. In some embodiments, the inlet 254 and/or the outlet 256 may be defined and/or formed by the pump housing 252. According to some embodiments, the cold plate 210 may be coupled to the pump housing 252. The cold plate 210 may, for example, be coupled to the pump housing 252 to create a hydraulic and/or hermetic seal to substantially prevent the fluid from leaking from the pump housing 252 and/or to substantially prevent air from entering the pump housing 252. In some embodiments, the seal between the cold plate 210 and the pump housing 252 may comprise an O-ring (not shown in FIG. 2A or FIG. 2B) and/or other sealant or fastener.

According to some embodiments, such as in the case that the reservoir 230 and the pump 250 are integrated, the coupling of the two components 230, 250 may be augmented with one or more seals 264 to substantially prevent the fluid from leaking from the system 200. In some embodiments, the coupling of the reservoir 230 and the pump 250 (and/or the pump housing 252) may be conducted in any manner that is or becomes known or practicable. For example, any type or configuration of seal 264 (such as the O-rings shown) that is or becomes known may be utilized to facilitate the creation of a hydraulic and/or hermetic seal between the reservoir 230 and the pump 250. In some embodiments, the reservoir 230 and/or the pump housing 252 may be configured to accept and/or receive seal material to provide an improved seal 264. The components 230, 252 may, for example, comprise any number of grooves, detents, threads, lips, seats, and/or other features that facilitate coupling and/or creation of a hydraulic and/or hermetic seal (e.g. to substantially prevent fluid from leaking from the system 200 and/or to substantially prevent air from infiltrating the system 200). In some embodiments, other sealants, adhesives, fasteners, systems, devices, and/or methods may be used to couple and or seal the reservoir 230 to the pump 250 and/or pump housing 252.

According to some embodiments, the reservoir 230 may be configured to couple to the pump 250, the pump housing 252, and/or the inlet 254. As shown in FIG. 2A and FIG. 2B, for example, the reservoir 230 may comprise upper and lower annular surfaces coupled at their extremities and/or extents to define the volume 232 there between. In some embodiments, the annular surfaces may define central and/or circular voids 299A/299B through which the inlet 254 may extend. The inlet 254 may, for example, extend through the volume 232 (e.g., through the center of the volume 232). According to some embodiments, the reservoir 230 may slip over and/or otherwise couple and/or removably attach to the inlet 254 (and/or another portion of the housing 252). In some embodiments, the inlet 254 may comprise one or more paths 258 that hydraulically couple the inlet 254 to the volume 232 of the reservoir 230. The inlet 254 may, for example, comprise one or more holes and/or other passages that allow fluid to pass between the inlet 254 and the volume 232 of the reservoir 230.

According to some embodiments, the path 258 may be configured such that the inlet 254 and the reservoir 230 may be hydraulically coupled in the case that the reservoir 230 is attached (and/or removably attached) to the inlet 254 and/or the pump housing 252. In some embodiments, the seals 264 may comprise sealing devices such as O-rings to substantially prevent the fluid from leaking between the inlet 254 and the reservoir 230.

In some embodiments, the system 200 may also or alternatively comprise the motor 270. The motor 270 may, for example, power the impeller 260 to direct the fluid toward the outlet 256. According to some embodiments, any type and/or configuration of motor that is or becomes known may be utilized to provide power to the impeller 260. As shown in FIG. 2A and FIG. 2B, for example, the motor 270 may be or include a brushless motor such as a brushless direct current (DC) motor. The motor 270 may comprise, for example, one or more electromagnets 272 (and/or electromagnetic coils), one or more magnets 274 (e.g., permanent magnets), and/or a rotor 276. In some embodiments, the magnets 274 may be coupled to the rotor 276 (e.g., as is typical in brushless DC motors). According to some embodiments, one or more bearings 278 may be utilized to reduce friction and/or facilitate motion of the rotor 276.

As shown in FIG. 2A and FIG. 2B, the motor 270 may be integrated into the pump 250. The rotor 276 (and the magnets 274 coupled thereto) may, for example, rotate within the pump housing 252. The bearings 278 may, according to some embodiments, facilitate the rotation of the rotor 276 within the pump housing 252. In some embodiments, some of the components 272, 274, 276 of the motor 270 may be separated by a wall of the pump housing 252. As shown in FIG. 2A and FIG. 2B, for example, the rotor 276 and the magnets 274 may be disposed within the pump housing 252 (e.g., exposed to the fluid), while the electromagnets 272 may be disposed and/or coupled to the outside of the pump housing 252 (e.g., not exposed to the fluid). The magnetic and/or electromagnetic forces required to operate the motor 270 may, for example, pass through the wall of the pump housing 252 to permit the motor 270 to be integrated into the pump 250.

In some embodiments, integrating the motor 270 into the pump 250 may eliminate the need for a shaft (e.g., to power the impeller) and/or may eliminate the need for dynamic hydraulic and/or hermetic seals (e.g., that would typically be required surrounding a powered shaft protruding from the pump housing 252). The impeller 260 may, for example, be disposed upon and/or coupled to the rotor 276. As shown in FIG. 2A and FIG. 2B, for example, the vanes 262 of the impeller 260 may be disposed on the bottom portion of the rotor 276 that rotates over the surface 218 of the cold plate 210. According to some embodiments, integrating the motor 270 into the pump 250 may reduce the potential for wear, leaking, and/or other problems associated with the pump 250.

The only non-fluid path seal that may be required in the system 200, for example, may be the seal between the cold plate 210 and the pump housing 252. The integrated motor 270 may be brushless and/or may not require a shaft penetrating the pump housing 252. Incorporating the rotor 276 and/or the magnets 274 into the fluid within the pump housing 252 may also or alternatively, according to some embodiments, create a hydroscopic bearing effect that may reduce the wear on various system 200 components (such as the bearings 278, the rotor 276, and/or the pump housing 252 itself). In some embodiments, the integrated motor 270 may also or alternatively allow the diameter of the impeller 260 and/or rotor 276 to be larger than in typical pumps and/or motors. The larger diameter impeller 260 and/or rotor 276 may, for example, allow the motor to spin at lower revolutions per minute (RPM) than typical motors, while producing higher torque, flow, and/or pressure.

In some embodiments, the system 200 may provide many advantages over typical cooling solutions. The integration of the pump 250 and the reservoir 230 may, for example, substantially reduce the space required for the cooling system 200, may substantially reduce the length of the fluid path, and/or may otherwise increase the efficiency of the system 200. According to some embodiments, the close coupling of the pump 250 and the reservoir 230 may, for example, substantially reduce the length of the path required for fluid travel and/or may substantially reduce friction losses associated with the fluid path. In other words, the combination pump 250 and reservoir 230 in the system 200 may not only reduce cooling solution space, but may also increase system 200 efficiency by reducing friction losses in the fluid path, reducing the length and/or size of the fluid path (e.g., requiring less fluid volume), and/or reduce the possibility for fluid leakage (e.g., due to reduction of dynamic seals and/or due to reducing the wetted area of components through which the fluid may seep). Typical systems include much longer fluid path lengths in contact with externally exposed plastic areas. No hoses and/or tubes may be necessary in the cooling system 200, for example. In some embodiments, the close coupling of the pump 250 and the reservoir 230 may also or alternatively provide a modular arrangement that facilitates the integration of the system 200 with other cooling solution components (not shown). The integration of the reservoir 230 with the pump 250 may, for example, allow the pump 250 (and/or the inlet 254 thereof) to be directly coupled to a heat exchanger (e.g., the heat exchanger 120). In some embodiments, the heat exchanger may be any type or configuration of heat exchanger that is or becomes known. According to some embodiments, the integration may allow and/or facilitate the compatibility of the pump 250 with various types of heat exchangers and/or other cooling solution components. The pump 250 may, for example, be coupled to a plurality of heat exchangers.

Figure 3:
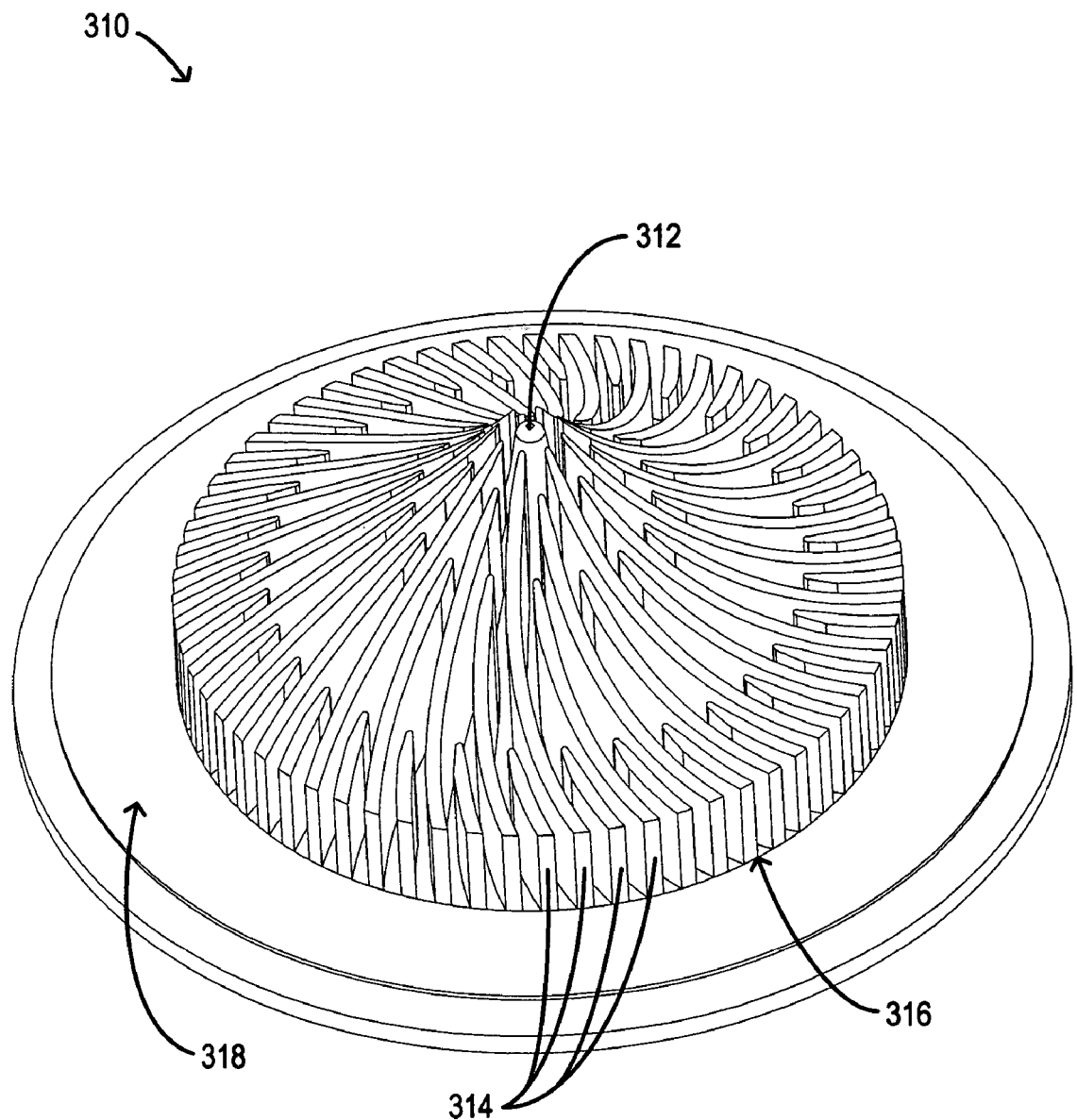
FIG. 3 is a perspective diagram of a cold plate according to some embodiments.

Referring now to FIG. 3, a perspective diagram of a cold plate 310 according to some embodiments is shown. In some embodiments, the cold plate 310 may be similar to the cold plates 110, 210 described in conjunction with any of FIG. 1, FIG. 2A, and/or FIG. 2B. The cold plate 310 may comprise, for example, a central portion 312, one or more fins 314, a radius 316, and/or a surface 318. According to some embodiments, the components 312, 314, 316, 318 of the system 300 may be similar in configuration and/or functionality to the similarly-named components described in conjunction with FIG. 2A and/or FIG. 2B. In some embodiments, fewer or more components than are shown in FIG. 3 may be included in the system 300.

The cold plate 310 may, according to some embodiments, be or include a disk and/or other circular configuration. As shown in FIG. 3, for example, the cold plate 310 may be a finned-disk (e.g., comprising the fins 314). In some embodiments, the cold plate 310 may be comprised of copper and/or another thermally conductive material. The cold plate 310 may, for example, be a finned copper disk. According to some embodiments, the cold plate 310 may be manufactured using a metal injection molding (MIM) process or various forging techniques. The cold plate 310 may, in some embodiments, also or alternatively be shaped and/or otherwise configured to fit inside and/or otherwise be integrated with a pump such as the pump 250.

According to some embodiments, the cold plate 310 may be or include an HIS coupled to an electronic device and/or electrical component (not shown in FIG. 3) and/or may otherwise be associated with an IHS device. The cold plate 310 may, for example, receive heat from the electronic device (e.g., coupled to the underside of the cold plate 510). According to some embodiments, adhesive and/or thermal grease and/or other thermal interface material may be applied between the electronic device and the cold plate 310 to facilitate heat transfer and/or coupling. In some embodiments, a fluid may also or alternatively be passed over and/or through the cold plate 310 to remove heat from the cold plate 310.

In some embodiments, the central portion 312 of the cold plate 310 may be the hottest portion of the cold plate 310 (e.g., the temperature of the cold plate 310 may decrease as the radius increases). This may be due at least in part, for example, to the concentration of heat from the electronic device toward the central portion 312 of the cold plate 310. The fins 314 of the cold plate 310 may, according to some embodiments, be configured to efficiently remove and/or dissipate heat from the cold plate 310. The fins 314 may, as shown in FIG. 3 for example, be taller near the central portion 312 of the cold plate 310 and decrease in height, size, and/or surface area as the radius of the cold plate 310 increases. The fins 314 may also or alternatively increase in number (e.g., as shown in FIG. 3) as the radius of the cold plate 310 increases. The number and/or size of the fins 314 may be designed and/or controlled, according to some embodiments, to manage the cross-sectional area of the cold plate 310 as a function of the radius of the cold plate 310. The ratio may be maintained at a substantially constant value, for example, to increase the efficiency with which the cold plate 310 may transfer heat to the fluid.

The fins 314 of the cold plate 310 may also or alternatively be curved, as shown in FIG. 3, for example. The orientation of the fins 314 may, according to some embodiments, cause the fluid directed toward the cold plate 310 to be directed in a radial fashion toward the radius 316 of the cold plate 310. The fins 314 may, for example, terminate at the radius 316 so that an impeller (e.g., the impeller 260) may rotate around the fins 314. The surface 318 situated between the radius 316 and the edge of the cold plate 310 may, for example, be used to rotate the vanes of an impeller around the fins 314. The curvature of the fins 314 may, according to some embodiments, direct the fluid toward the vanes of the impeller, increasing the efficiency of the fluid flow through the impeller.

Figure 4:
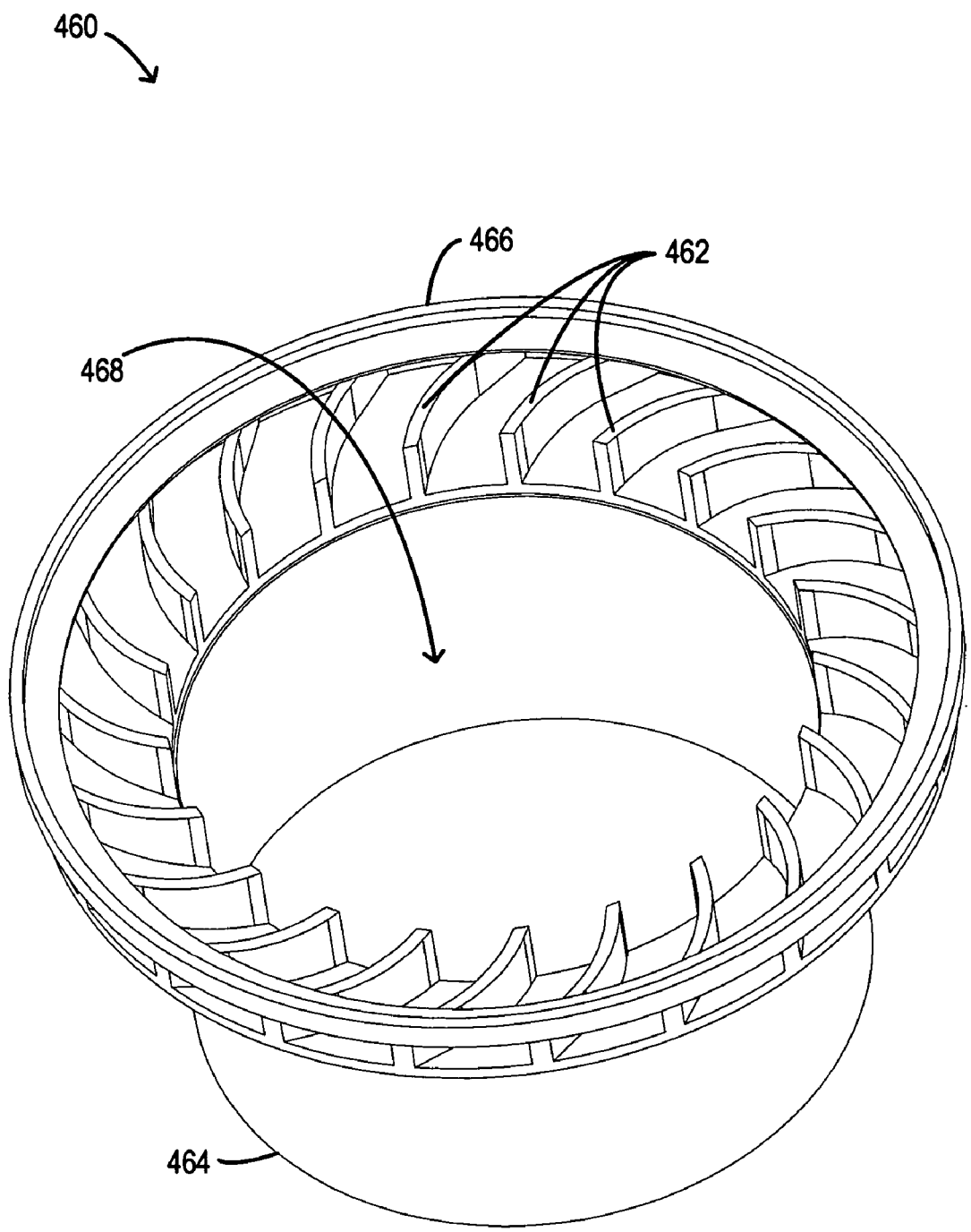
FIG. 4 is a perspective diagram of an impeller according to some embodiments.

Turning now to FIG. 4, a perspective diagram of an impeller 460 according to some embodiments is shown. In some embodiments, the impeller 460 may be similar to the impeller 260 described in conjunction with FIG. 2A and/or FIG. 2B. The impeller 460 may comprise, for example, one or more vanes 462, a shaft portion 464, and/or a bottom edge 466. In some embodiments, the impeller 460 may also or alternatively define a cavity 468. According to some embodiments, the components 462 of the system 400 may be similar in configuration and/or functionality to the similarly-named components described in conjunction with FIG. 2A and/or FIG. 2B. In some embodiments, fewer or more components than are shown in FIG. 4 may be included in the system 400.

According to some embodiments, the perspective diagram of the impeller 460 may be a view of the bottom of the impeller 460. The bottom edge 466 of the impeller 460 may, for example, be configured to travel along the surface 218, 318 of the cold plate 210, 310. In some embodiments, the shaft portion 464 of the impeller 460 may also or alternatively be or include the rotor 276 of the motor 270. The impeller 460 may, for example, fit within the pump housing 252, with the cold plate 210, 310 fitting into and/or otherwise disposed within the cavity 468 defined by the impeller 460. In some embodiments for example, a fluid used to transfer heat from a cold plate may travel up through the cavity 468 toward the vanes 462. The fluid may, for example, be directed and/or induced to flow toward the vanes 462 by various fins (e.g., fins 214, 314) of the cold plate.

According to some embodiments, the impeller 460 may spin around the cold plate, receiving the fluid and directing the fluid toward one or more particular points. The fluid may be directed, for example, toward an outlet such as the outlet 256 defined by the pump housing 252. In some embodiments, the vanes 462 may be curved (as shown in FIG. 4). The curvature of the vanes 462 may, according to some embodiments, be similar to and/or otherwise associated with a curvature of the fins of the cold plate (not shown in FIG. 4) disposed within the cavity 468. The impeller 460 and/or the vanes 462 may be comprised of any materials that are or become known or practicable.

Figure 5:
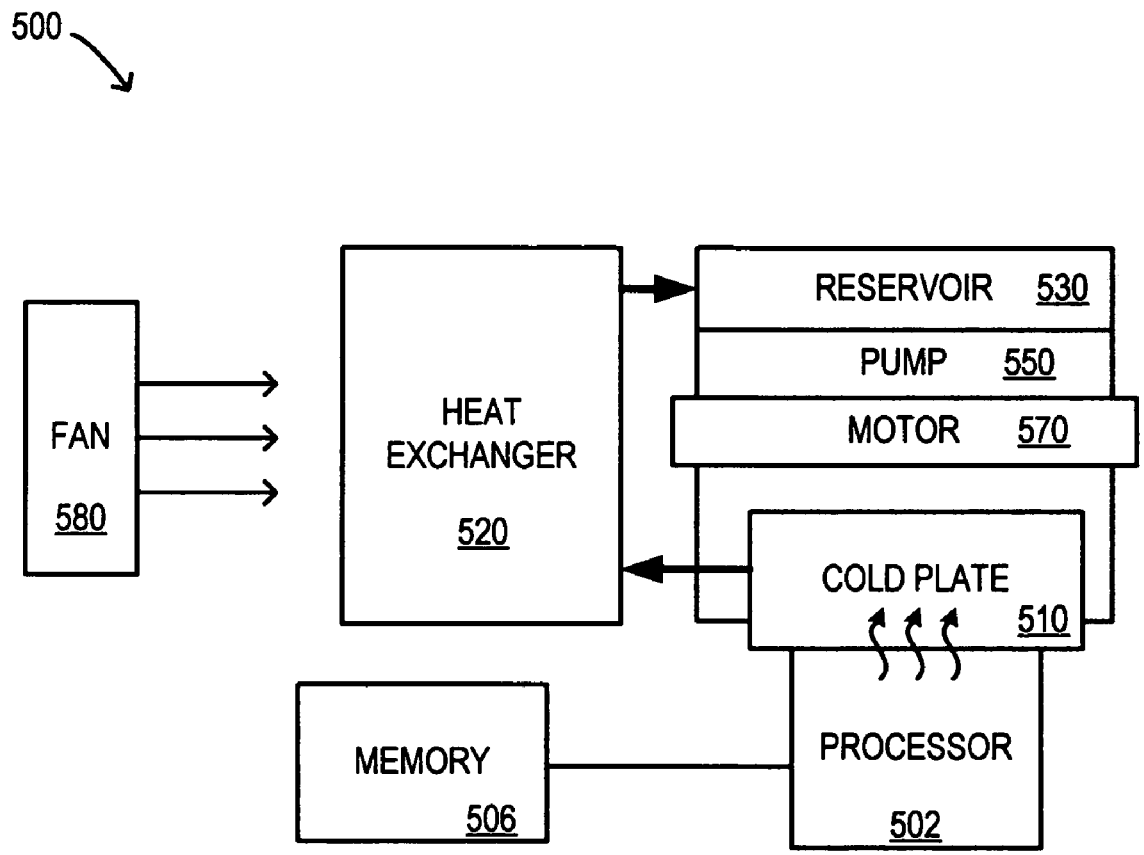
FIG. 5 is a block diagram of a system according to some embodiments.

Turning to FIG. 5, a block diagram of a system 500 according to some embodiments is shown. In some embodiments, the system 500 may be similar to the systems 100, 200, 310, 460 described in conjunction with any of FIG. 1, FIG. 2A, FIG. 2B, FIG. 3, and/or FIG. 4. The system 500 may comprise, for example, a processor 502, a memory 506, a cold plate 510, a heat exchanger 520, a reservoir 530, a pump 550, a motor 570, and/or a fan 580. According to some embodiments, the components 502, 510, 520, 530, 550, 570, 580 of the system 500 may be similar in configuration and/or functionality to the similarly-named components described in conjunction with any of FIG. 1, FIG. 2A, FIG. 2B, FIG. 3, and/or FIG. 4. In some embodiments, fewer or more components than are shown in FIG. 5 may be included in the system 500.

The processor 502 may be or include any number of processors, which may be any type or configuration of processor, microprocessor, and/or micro-engine that is or becomes known or available. In some embodiments, other electronic and/or electrical devices may be utilized in place of or in addition to the processor 502. The processor 502 may, for example, be or include any device, object, and/or component that generates, stores, and/or requires removal of heat. According to some embodiments, the processor 502 may be an XScale® Processor such as an Intel® PXA270 XScale® processor. The memory 506 may be or include, according to some embodiments, one or more magnetic storage devices, such as hard disks, one or more optical storage devices, and/or solid state storage. The memory 506 may store, for example, applications, programs, procedures, and/or modules that store instructions to be executed by the processor 502. The memory 506 may comprise, according to some embodiments, any type of memory for storing data, such as a single data rate random access memory (SDR-RAM), a double data rate random access memory (DDR-RAM), or a programmable read only memory (PROM).

In some embodiments, the cold plate 510 may be or include an IHS coupled to the processor 502. The cold plate 510 may, for example, remove and/or receive heat (e.g., via conduction) from the processor 502 (e.g., represented by the wavy lines in FIG. 5). According to some embodiments, such as shown in FIG. 5 for example, the cold plate 510 may be integrated with the pump 550. The cold plate 510 may, for example, transfer heat to a fluid in the pump 550 and/or facilitate the flow of the fluid within the pump 550 as described herein. In some embodiments, the motor 570 may also or alternatively be integrated with the pump 550. The motor 570 may, for example, include components disposed within the pump 550 and/or components disposed outside of the pump 550. In some embodiments, the motor 570 may power the pump 550 to direct the fluid (e.g., the heated fluid) to the heat exchanger 520. The heat exchanger 520 may then, for example, transfer and/or receive heat from the fluid and dissipate and/or remove the heat from and/or within the system 500. The fan 580 may, in some embodiments, facilitate the removal and/or dissipation of heat by blowing air toward the heat exchanger 520. According to some embodiments, the reservoir 530 to store the fluid (and/or a portion thereof) may also or alternatively be integrated with the pump 550. The fluid (e.g., the cooled fluid) may, for example, be directed from the heat exchanger 520 into the reservoir 530 which may, for example, be hydraulically and/or physically coupled to the pump 550. According to some embodiments, the cooled fluid may be sent back to the cold plate 510 to continue the cooling cycle.

In some embodiments, any or all of the cooling components 510, 520, 530, 550, 570, 580 may be or include components similar to those described herein. According to some embodiments, one or all of the cooling components 510, 520, 530, 550, 570, 580 may also or alternatively comprise one or more conventional devices to perform the required functionality of the particular component. As an example, the heat exchanger 520 may, in some embodiments, be a typical heat sink and/or heat pipe. The pump 550 may also or alternatively, for example, be a typical centrifugal pump powered by a standard DC motor (e.g., coupled by a shaft to the pump 550). According to some embodiments, the reservoir 530 may be a conventional reservoir and/or volume adapted to be hydraulically, physically, and/or directly hydraulically and/or physically coupled to and/or otherwise integrated with the pump 550.

The several embodiments described herein are solely for the purpose of illustration. Other embodiments may be practiced with modifications and alterations limited only by the claims.

What is claimed is:

1. A system, comprising:
a pump comprising:
a housing defining an inlet to accept a fluid and an outlet to evacuate the fluid; and
an impeller disposed within the housing, wherein the impeller is to move the fluid toward the outlet;
a motor to power the impeller;
a reservoir hydraulically coupled to the inlet, wherein the reservoir comprises:
an upper annular surface and a lower annular surface, wherein the upper annular surface defines a first central circular void, wherein the lower annular surface defines a second central circular void, wherein the annular surfaces are coupled at extents of the annular surfaces such that a volume is defined there between, wherein the inlet extends through the first central circular void and the second central circular void and comprises at least one hydraulic path connecting the inlet and the volume of the reservoir, and wherein a radius of the second central circular void is greater than a radius of the first central circular void; and
a cold plate disposed at least partially within the housing.

2. The system of claim 1, wherein the pump accepts the fluid from one of a plurality of heat exchangers.

3. The system of claim 1, wherein the cold plate comprises a plurality of cold plates.

4. The system of claim 1, wherein the reservoir is coupled to the housing.

5. The system of claim 4, wherein the reservoir is removably coupled to the housing.

6. The system of claim 1, further comprising:
one or more seals coupled between the reservoir and the inlet, wherein the one or more seals are to substantially prevent the fluid from escaping the volume of the reservoir through the voids.

7. The system of claim 1, wherein cold plate comprises:
a first portion disposed within the housing; and
a second portion disposed outside of the housing.

8. The system of claim 7, wherein the first portion of the cold plate is substantially circular in shape, and wherein a plurality of vanes of the impeller revolve around the center of the first portion of the cold plate.

9. The system of claim 1, wherein the impeller defines a cavity in which the cold plate is disposed.

10. A system, comprising:
a pump comprising:
a housing defining an inlet to accept a fluid and an outlet to evacuate the fluid; and
an impeller disposed within the housing, wherein the impeller is to move the fluid toward the outlet;
a reservoir hydraulically coupled to the inlet, wherein the reservoir comprises:

an upper annular surface and a lower annular surface, wherein the upper annular surface defines a first central circular void, wherein the lower annular surface defines a second central circular void, wherein the annular surfaces are coupled at extents of the annular surfaces such that a volume is defined there between, wherein the inlet extends through the first central circular void and the second central circular void and comprises at least one hydraulic path connecting the inlet and the volume of the reservoir, and wherein a radius of the second central circular void is greater than a radius of the first central circular void; and a motor to power the impeller, wherein the motor comprises a rotor and at least two magnets disposed within the housing and at least two electromagnetic coils disposed outside of the housing.

11. The system of claim 10, wherein the impeller is disposed on at least one portion of the rotor.

12. The system of claim 10, further comprising:
a cold plate disposed at least partially within the housing.

13. A system, comprising:
a heat exchanger;
a pump comprising:
    a housing defining an inlet to accept a fluid from the heat exchanger and an outlet to evacuate the fluid to the heat exchanger; and
    an impeller disposed within the housing, wherein the impeller is to move the fluid toward the outlet;
    a motor to power the impeller;
    a reservoir hydraulically coupled to the inlet, wherein the reservoir comprises:
an upper annular surface and a lower annular surface, wherein the upper annular surface defines a first central circular void, wherein the lower annular surface defines a second central circular void, wherein the annular surfaces are coupled at extents of the annular surfaces such that a volume is defined there between, wherein the inlet extends through the first central circular void and the second central circular void and comprises at least one hydraulic path connecting the inlet and the volume of the reservoir, and wherein a radius of the second central circular void is greater than a radius of the first central circular void; and
    a cold plate disposed at least partially within the housing;
    a processor coupled to the cold plate; and
    a double data rate memory coupled to the processor.

14. The system of claim 13, wherein the motor comprises a rotor and at least two magnets disposed within the housing and at least two electromagnetic coils disposed outside of the housing.

15. The system of claim 14, wherein the impeller is disposed on at least one portion of the rotor.

16. The system of claim 13, wherein the reservoir is removably coupled to the housing.

\* \* \* \* \*